United States Patent
Nakai et al.

(10) Patent No.: US 6,570,442 B2
(45) Date of Patent: May 27, 2003

(54) RADIO FREQUENCY SIGNAL OUTPUT MODULE HAVING RADIO-FREQUENCY POWER AMPLIFIER AND ISOLATOR ELEMENT

(75) Inventors: Shinya Nakai, Tokyo (JP); Ryoichi Kondo, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 09/922,727

(22) Filed: Aug. 7, 2001

(65) Prior Publication Data

US 2002/0017952 A1 Feb. 14, 2002

(30) Foreign Application Priority Data

Aug. 8, 2000 (JP) ........................................ 2000-239769

(51) Int. Cl.[7] ................................................ H03G 3/20
(52) U.S. Cl. .................. 330/129; 330/151; 330/124 R; 330/284; 330/285
(58) Field of Search ................................ 333/129, 286, 333/302; 330/124 R, 302, 306, 151

(56) References Cited

U.S. PATENT DOCUMENTS

| | | | |
|---|---|---|---|
| 5,230,093 A | 7/1993 | Rich et al. ................ | 455/126 |
| 5,416,441 A * | 5/1995 | Nagano ..................... | 330/129 |
| 5,675,286 A * | 10/1997 | Baker et al. .............. | 330/129 |
| 5,936,486 A * | 8/1999 | Tanaka ..................... | 333/193 |
| 5,939,939 A * | 8/1999 | Gaynor et al. ........... | 330/124 R |
| 5,945,887 A | 8/1999 | Makino et al. ........... | 333/1.1 |
| 6,262,630 B1 * | 7/2001 | Eriksson ................... | 330/129 |
| 6,281,748 B1 * | 8/2001 | Klomsdorf et al. ...... | 330/129 |

FOREIGN PATENT DOCUMENTS

| | | |
|---|---|---|
| EP | 0 638 953 | 2/1995 |
| EP | 1 119 111 | 7/2001 |
| JP | 2000-124710 | 4/2000 |

\* cited by examiner

*Primary Examiner*—Michael Tokar
*Assistant Examiner*—Lam T Mai
(74) *Attorney, Agent, or Firm*—Oblon, Spivak, McClelland Maier & Neustadt, P.C.

(57) ABSTRACT

A radio frequency signal output module having a power amplifier and an isolator element is provided in which a radio-frequency output stage can be largely reduced in size and thickness. The radio frequency signal output module comprises a dielectric multilayer substrate; a radio-frequency power amplifier circuit; an isolator element; an impedance matching circuit which is inserted and connected between the radio-frequency power amplifier circuit and the isolator element; and a feedback loop for controlling the gain of the radio-frequency power amplifier circuit. The radio-frequency power amplifier circuit, the isolator element, the impedance matching circuit, and the feedback loop are integrally mounted on the dielectric multilayer substrate, and the feedback loop is branched from the impedance matching circuit, and connected to the radio-frequency power amplifier circuit.

9 Claims, 10 Drawing Sheets

RADIO FREQUENCY SIGNAL OUTPUT MODULE HAVING RADIO-FREQUENCY POWER AMPLIFIER AND ISOLATOR ELEMENT

BACKGROUND OF THE INVENTION

The present invention relates to a radio frequency signal output module having radio frequency power amplifier and an isolator element which is used in a transmitter or the like of a portable telephone or a mobile communication terminal.

Recently, size reduction and weight reduction in a communication apparatus such as a portable telephone or a mobile communication terminal is increasingly demanded. In accordance with this, reduction of the size, the weight, and the thickness of each component constituting such a communication apparatus, decreasing the number of components, and reduced power consumption are strongly requested.

In a communication apparatus such as a portable telephone or a mobile communication terminal, usually, an isolator element which is an irreversible directional element is connected to the output of a radio-frequency power amplifier circuit in a transmission section. This connection is performed so that the isolator element blocks a radio-frequency power reflected as a result of a state change of an antenna from reaching the radio-frequency power amplifier circuit, whereby deterioration of the radio-frequency power amplifier circuit and increase of an unwanted output are prevented from occurring.

In the conventional art, a radio-frequency power amplifier circuit is formed as a module on a dielectric substrate, and then housed in a metal case serving as a shield. By contrast, in an isolator element, a magnetic material must be enclosed by a high permeability metal because of the structure of the element. In this way, an isolator element is different in material and structure from electronic components which are formed on a usual insulator substrate, and hence produced as an independent component. Namely, an isolator element of the conventional art is housed in a metal case which is different from that of a radio-frequency power amplifier circuit.

Although a radio-frequency power amplifier circuit and an isolator element are closely related in function with each other as described above, they are treated as independent components until they are mounted into a portable telephone or a mobile communication terminal. In other words, conventionally, a radio-frequency power amplifier circuit and an isolator element are prepared as independent components, respectively, and the components are then mounted by soldering onto a motherboard configured by a dielectric multilayer substrate.

Since a radio-frequency power amplifier circuit and an isolator element are handled as independent components, it is difficult to miniaturize them. When these components are mounted on a motherboard, the thickness of the isolator element is added to that of the motherboard to increase the total height, thereby producing a problem in that the whole of the radio-frequency output stage cannot be reduced in size and thickness.

An isolator element is produced so that all ports have an input/output impedance of 50 Ω which is equal to a standard transmission line impedance. A radio-frequency power amplifier circuit has an output impedance of 30 Ω or less, for example, 10 Ω. In order to connect a radio-frequency power amplifier circuit with an isolator element, therefore, an impedance matching circuit must be disposed. Furthermore, also an APC circuit must be disposed in order to control the output of the radio-frequency power amplifier circuit. Therefore, it is required to mount chip components for constituting L and C on a motherboard, or to form L by means of a copper foil pattern on the surface of the motherboard. Also an impedance matching circuit and an APC circuit configured as described above form factors of blocking reduction in size and thickness of the radio-frequency output stage.

Furthermore, components such as a radio-frequency power amplifier circuit and an isolator element must be individually obtained, and an impedance matching circuit and an APC circuit which are used for connecting such components with each other must be separately designed. Therefore, design of a communication apparatus such as a portable telephone or a mobile communication terminal is cumbersome, and affected also by variation of individual components. As a result, there is a fear that the performance of the whole communication apparatus cannot be surely maintained.

SUMMARY OF THE INVENTION

It is an object of the invention to provide a radio frequency signal output module having a radio-frequency power amplifier and an isolator element, which radio-frequency can be largely reduced in size and thickness.

It is another object of the invention to provide a radio frequency signal output module having a radio-frequency power amplifier and an isolator element which allows a communication apparatus such as a portable telephone or a mobile communication terminal to be easily designed, and which can suppress variation of the performance of the whole communication apparatus to a minimum level.

It is a further object of the invention to provide a radio frequency signal output module having a radio-frequency power amplifier and an isolator element in which the frequency characteristics of the isolator element can be easily adjusted.

According to the invention, it is provided a radio frequency signal output module comprises: a dielectric multilayer substrate; a radio-frequency power amplifier circuit; an isolator element; an impedance matching circuit which is inserted and connected between the radio-frequency power amplifier circuit and the isolator element; and a feedback loop for controlling a gain of the radio-frequency power amplifier circuit, the radio-frequency power amplifier circuit, the isolator element, the impedance matching circuit, and the feedback loop are integrally mounted on the dielectric multilayer substrate, and the feedback loop is branched from the impedance matching circuit, and connected to the radio-frequency power amplifier circuit.

The radio-frequency power amplifier circuit, the isolator element, the impedance matching circuit, and the feedback loop are integrally mounted on the dielectric multilayer substrate, and the feedback loop is branched from the impedance matching circuit, and connected to the radio-frequency power amplifier circuit. Since the radio-frequency output stage is integrated with the dielectric multilayer substrate in this way, the radio-frequency output stage can be largely reduced in size and thickness. This integration can decrease the number of components. Since the branching portion of the feedback loop is disposed in the impedance matching circuit, moreover, the structure of the feedback loop can be simplified. As a result, the radio-frequency output stage can be further miniaturized.

When the radio frequency signal output module having a radio-frequency power amplifier and an isolator element of the invention is used as described above, it is possible to attain the following effects: (1) the mounting area of the whole radio-frequency output stage can be reduced; (2) the designer of a communication apparatus such as a portable telephone or a mobile communication terminal is not required to individually obtain components such as a radio-frequency power amplifier circuit and an isolator element and design an impedance matching circuit for connecting the components, and hence the labor for designing the communication apparatus can be reduced; and (3) variation of the performance of the whole communication apparatus can be suppressed to a minimum level.

Preferably, the impedance matching circuit is built in the dielectric multilayer substrate, or formed in and on the dielectric multilayer substrate.

Preferably, the impedance matching circuit is formed by directional coupling means having a feedback terminal which is connected to the feedback loop. In this way, the input impedance of the directional coupling means is matched with the output of the power amplifier circuit, the output impedance is matched with the input of the isolator element, and the feedback loop is obtained from the impedance matching circuit, whereby the structure can be further simplified.

Preferably, at least a part of a capacitor which is connected to at least one port of the isolator element is configured by an internal electrode which is formed in the dielectric multilayer substrate, and a surface electrode which is formed on a surface of the dielectric multilayer substrate to be opposed to the internal electrode, the surface electrode being trimmable. When such a surface electrode is disposed, the frequency characteristics of the isolator element can be easily adjusted by changing the capacitance by means of laser trimming.

Preferably, main portions (specifically, a ferrite block and a central conductor) of the isolator element are integrally insertedly disposed in a mounting portion which is formed by removing a part of the dielectric multilayer substrate. More preferably, the mounting portion is a through hole of the dielectric multilayer substrate. Since the main portions of the isolator element are integrally insertedly disposed in the mounting portion such as a through hole, the radio-frequency power amplifier circuit and the isolator element can be integrated into one unit without increasing the total height, so that the thickness can be reduced.

Preferably, the radio-frequency power amplifier circuit and the isolator element are covered by a common shield case.

Preferably, the device further comprises: a SAW (Surface Acoustic Wave) element which is mounted on the dielectric multilayer substrate, and which is connected to an input of the radio-frequency power amplifier circuit; and a matching circuit which is built in the dielectric multilayer substrate, and which matches an output impedance of the SAW element with an input impedance of the radio-frequency power amplifier circuit.

BRIEF DESCRIPTION OF THE PREFERRED EMBODIMENTS

DETAILED DESCRIPTION OF THE PREFERRED EMBODIMENTS

Figure 1:
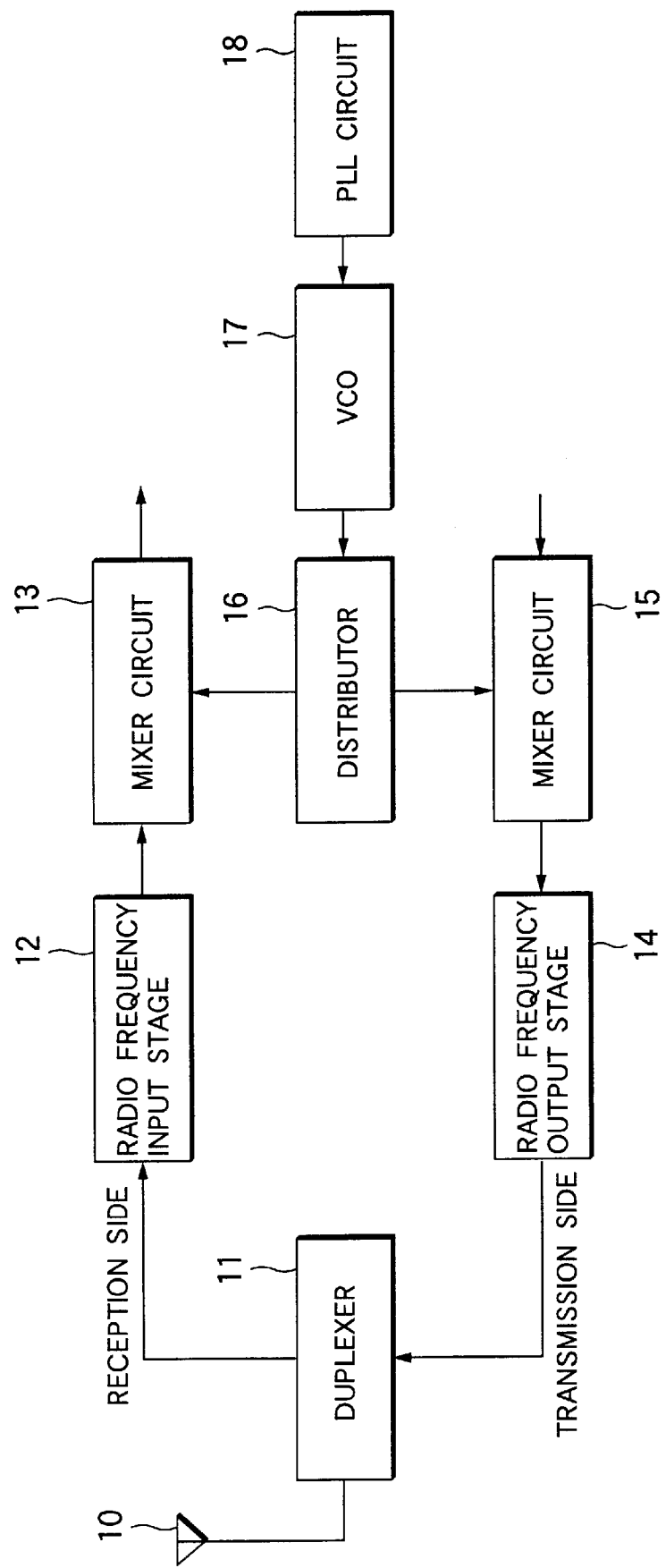
FIG. 1 is a block diagram showing the circuit configuration of an example of a portable telephone into which a radio frequency signal output module having a power amplifier and an isolator element of the invention is incorporated.

FIG. 1 is a block diagram showing the circuit configuration of an example of a portable telephone into which the radio frequency signal output module having a power amplifier and an isolator element of the invention is incorporated.

Referring to the figure, 10 denotes an antenna, 11 denotes a duplexer which splits transmission and reception signals, 12 denotes a radio-frequency input stage of the reception side and configured by, for example, plural stages of low-noise amplifiers and BPFs (Band Pass Filters), 13 denotes a mixer circuit of the reception side, 14 denotes a radio-frequency output stage of the transmission side configured by the a radio frequency signal output module having a power amplifier and an isolator element of the invention, 15 denotes a mixer circuit of the transmission side, 16 denotes a distributor, 17 denotes a VCO (Voltage-Controlled Oscillator), and 18 denotes a PLL (Phase-Locked Loop) circuit. In the invention, the radio frequency signal output module having a power amplifier and an isolator element constituting the radio-frequency output stage 14 is formed as a single integrated component.

Figure 2:
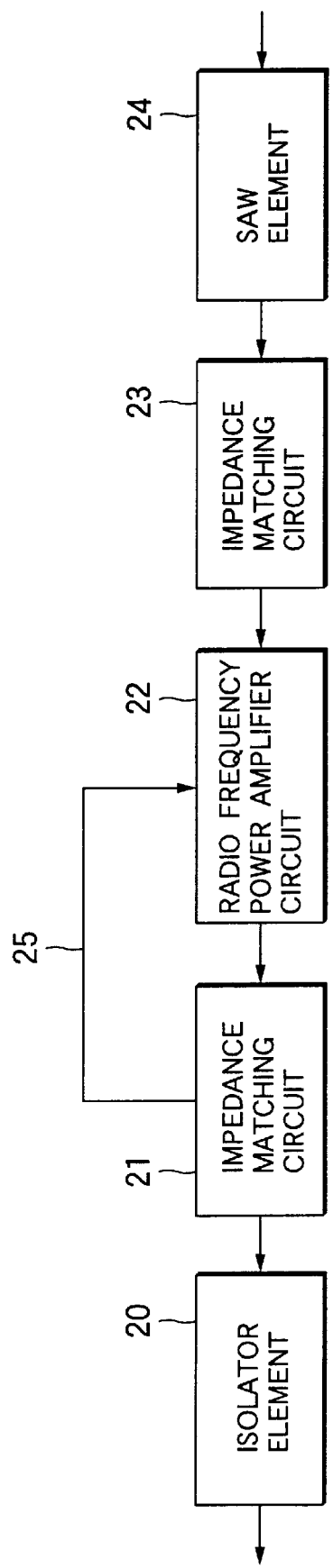
FIG. 2 is a block diagram showing the circuit configuration of an example of the integrated radio frequency signal output module having a power amplifier and an isolator element of FIG. 1.

FIG. 2 is a block diagram showing the circuit configuration of an example of the integrated radio frequency signal output module having a power amplifier and an isolator element of FIG. 1. This circuit configuration corresponds to a radio frequency signal output module having a power amplifier and an isolator element of an embodiment shown in FIG. 10.

Referring to the figure, 20 denotes an isolator element in which an output terminal is to be connected to the duplexer 11 (FIG. 1), 21 denotes an output impedance matching circuit which is connected to an input terminal of the isolator element 20, 22 denotes a radio-frequency power amplifier circuit which is connected to the input terminal of the isolator element 20 via the output impedance matching circuit 21, 23 denotes an input impedance matching circuit which is connected to an input terminal of the radio-frequency power amplifier circuit 22, 24 denotes a BPF configured by a SAW element which is connected to the input terminal of the radio-frequency power amplifier circuit 22 via the input impedance matching circuit 23, and 25 denotes a feedback loop which, in order to control the output of the radio-frequency power amplifier circuit 22, is branched from the output impedance matching circuit 21, and connected to the radio-frequency power amplifier circuit 22.

The isolator element 20 is an irreversible directional element in which, when a radio-frequency signal is passed through a ferrite block to which a DC static magnetic field is applied, the transmission characteristics are changed in accordance with the transmission direction. In order to reduce influence due to variation of load conditions of the radio-frequency power amplifier circuit 22, the isolator element 20 is inserted and connected between the radio-frequency power amplifier circuit 22 and the duplexer 11 on the antenna side. In order to match the impedances of the radio-frequency power amplifier circuit 22 and the isolator element 20 with each other, the output impedance matching circuit 21 is inserted and connected therebetween.

Figure 3:
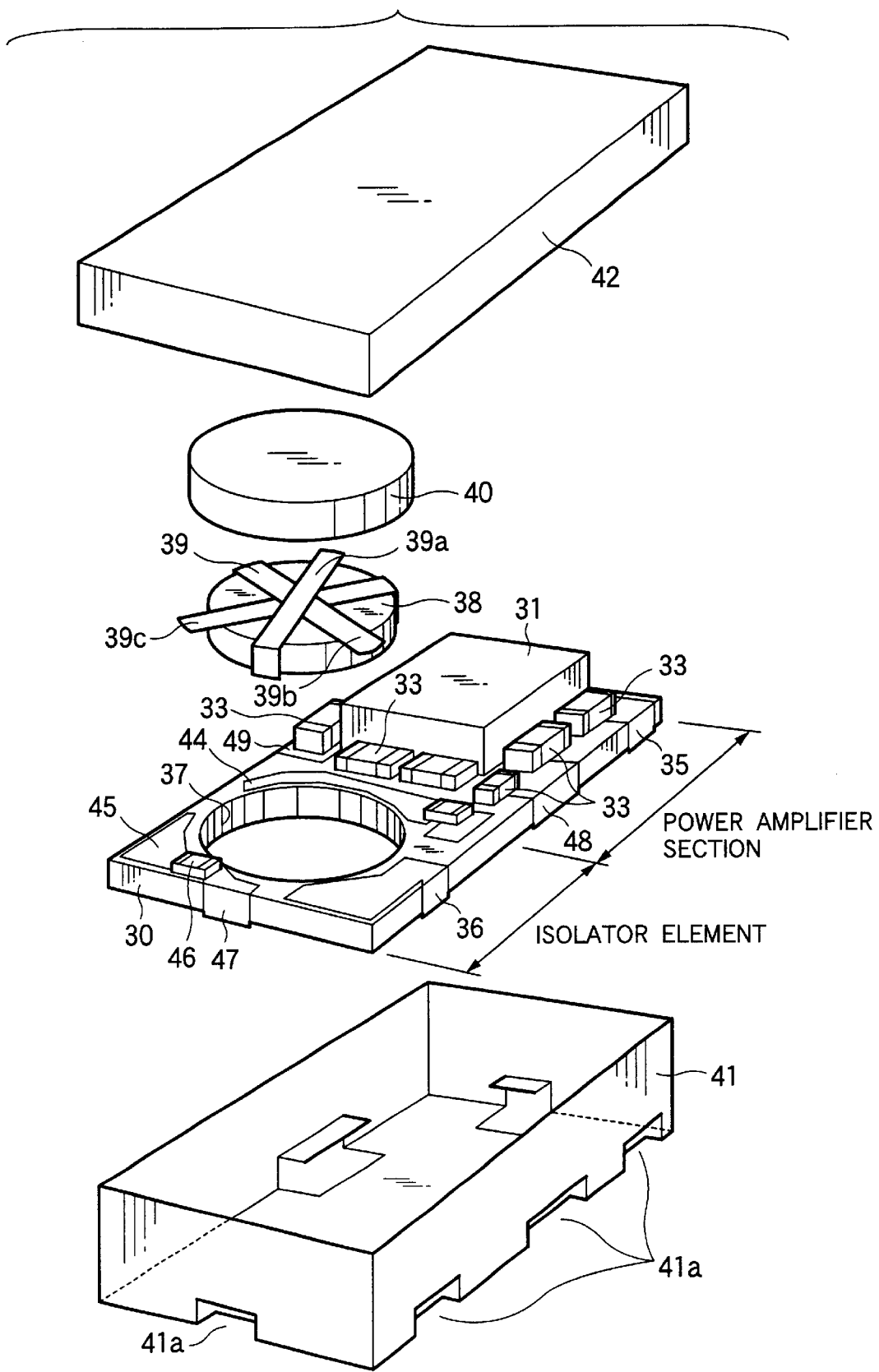
FIG. 3 is an exploded perspective view schematically showing the structure of a radio frequency signal output module having a power amplifier and an isolator element of a preferred embodiment of the invention.
Figure 4A:
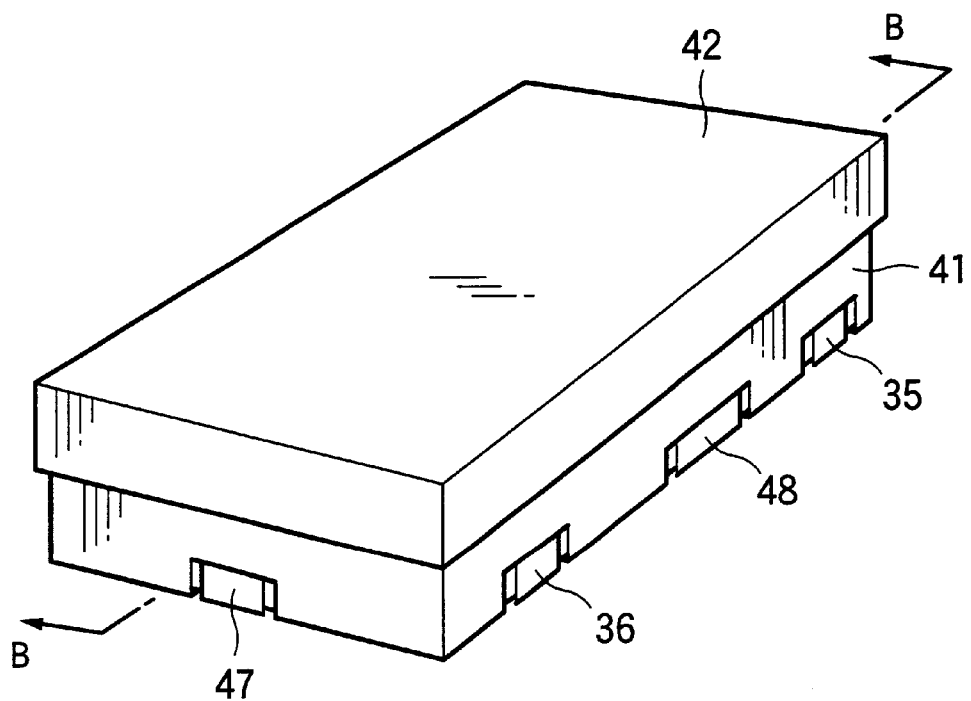
FIG. 4A shows a perspective view showing the appearance of the radio frequency signal output module having a power amplifier and an isolator element of the embodiment of FIG. 3.
Figure 4B:
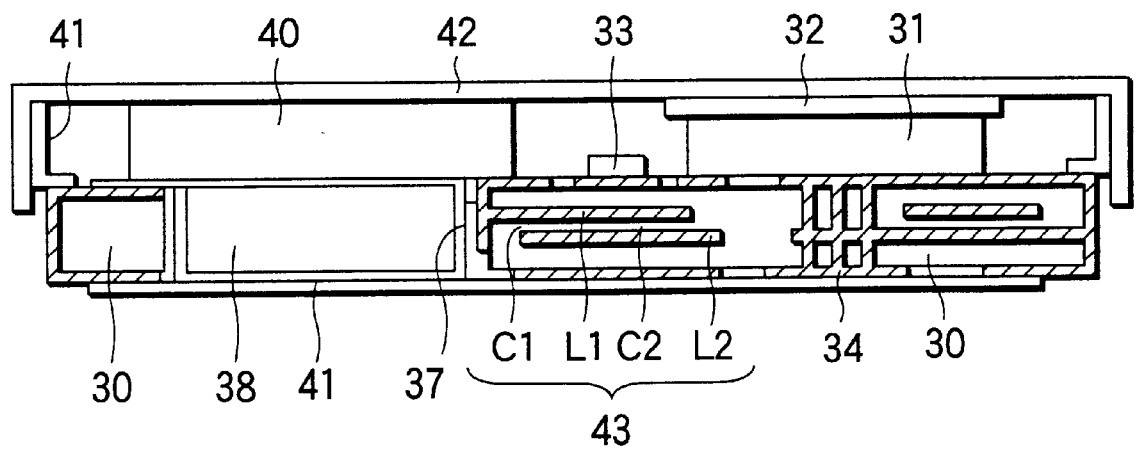
FIG. 4B is a section view taken along the line B—B of the perspective view.

FIG. 3 is an exploded perspective view schematically showing the structure of a radio frequency signal output module having a power amplifier and an isolator element of a preferred embodiment of the invention, FIG. 4A is a perspective view showing the appearance of the radio frequency signal output module having a power amplifier and an isolator element of the embodiment of FIG. 3, and FIG. 4B is a section view taken along the line B—B of FIG. 4A.

Referring to the figures, 30 denotes a single dielectric multilayer substrate, 31 denotes a power amplifier MMIC (Monolithic Microwave Integrated Circuit) chip which is mounted on the dielectric multilayer substrate 30, and which constitutes main portions of the radio-frequency power amplifier circuit, 32 denotes heat radiation spacers for the power amplifier MMIC chip 31, 33 denotes chip components which are similarly mounted on the dielectric multilayer substrate 30, 34 denotes an interconnection conductor which is formed in the dielectric multilayer substrate 30, and which is used for the radio-frequency power amplifier circuit, 35 denotes an input terminal electrode of the radio frequency signal output module having a power amplifier and an isolator element, 36 denotes an output terminal electrode of the radio frequency signal output module having a power amplifier and an isolator element and connected to an output port 39b of the isolator element, 37 denotes a circular through hole of the dielectric multilayer substrate 30, 38 denotes a circular ferrite block for the isolator element which is insertedly disposed in the through hole 37, 39 denotes a central conductor for the isolator element which is wound around the ferrite block 38, 40 denotes a circular permanent magnet for the isolator element, 41 denotes a metal case member which is formed by a soft magnetic material, and in which a plurality of windows 41a are formed so that the member is not in contact with the terminal electrodes, 42 denotes a lid member which is similarly formed by a soft magnetic material, and which cooperates with the metal case member 41 to cover the whole of the radio frequency signal output module having a power amplifier and an isolator element, 43 denotes an output impedance matching circuit which is configured by electrodes, a dielectric, and conductor patterns that are formed in the dielectric multilayer substrate 30, which matches the impedances of the power amplifier MMIC chip 31 and the isolator element with each other, and which has a branch terminal to a feedback loop directed to the power amplifier MMIC chip 31, 44 denotes an output electrode of the output impedance matching circuit 43 and connected to the input port 39a of the isolator element, 45 denotes an electrode which is grounded through a terminal resistor 46, and 47 to 49 denote ground terminal electrodes.

Figure 5A:
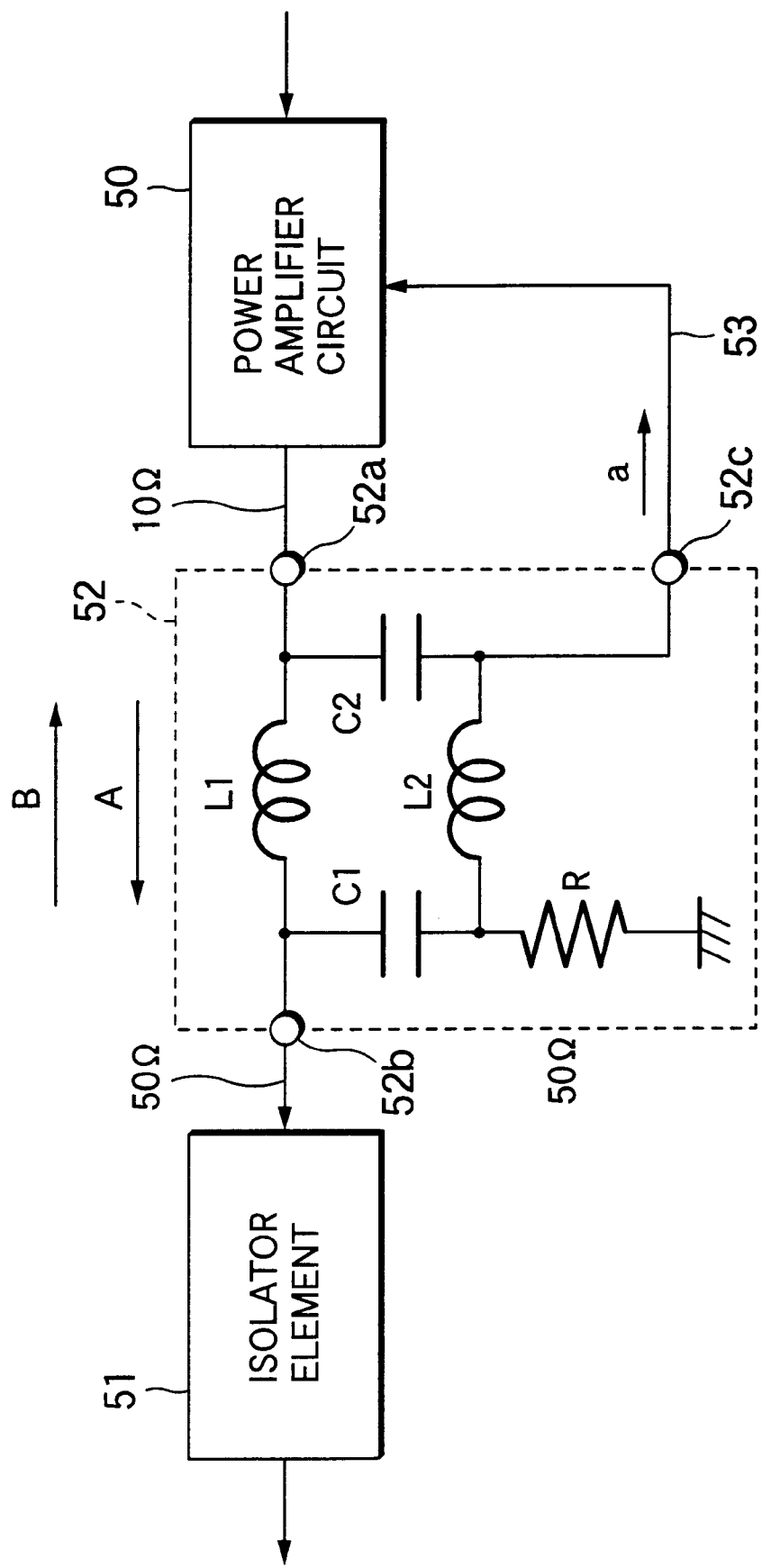
FIGS. 5A and 5B are block diagram illustrating the configuration of the embodiment, particularly, an output impedance matching circuit and a feedback loop.
Figure 5B:
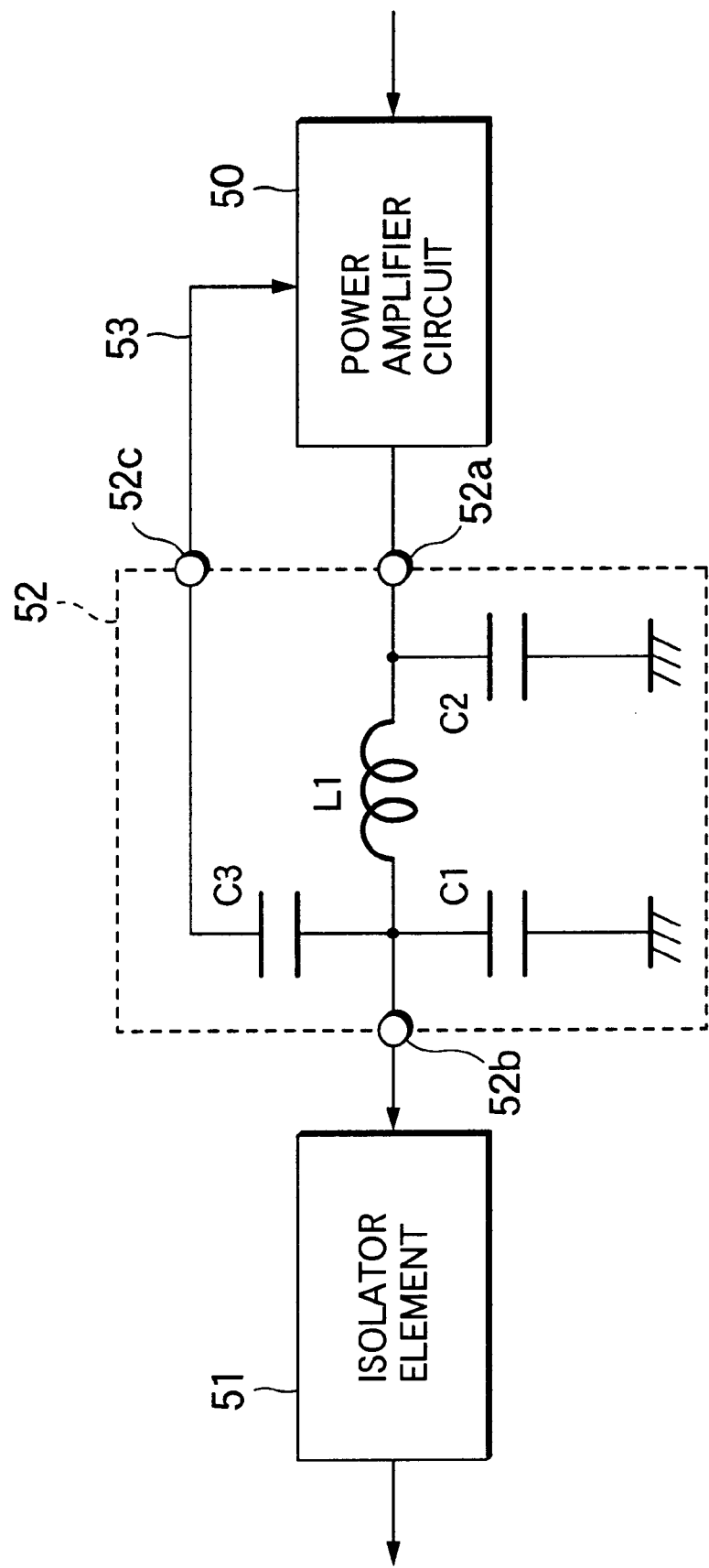

FIGS. 5A and 5B are block diagrams illustrating the configuration of the embodiment, particularly, the output impedance matching circuit and the feedback loop.

Referring to the FIG. 5A, 50 denotes a radio-frequency power amplifier circuit which is configured by the power amplifier MMIC chip 31, 51 denotes an isolator element, 52 denotes an output impedance matching circuit (43 in FIG. 4B), 52a denotes an input terminal (having an impedance of 10 Ω) of the output impedance matching circuit 52, 52b denotes an output terminal (having an impedance of 50 Ω) of the output impedance matching circuit 52, 52c denotes a feedback terminal of the output impedance matching circuit 52, and 53 denotes a feedback loop which returns from the feedback terminal 52c to the radio-frequency power amplifier circuit 50.

As shown in FIG. 5A, the output impedance matching circuit 52 (43) is configured by a directional coupler (coupler circuit) consisting of inductors L1 and L2, capacitors C1 and C2, and a load resistor R. The feedback terminal 52c is disposed inside the output impedance matching circuit 52, and at the junction of the capacitor C2 and the inductor L2. The feedback loop 53 is branched from the terminal, and then connected to the radio-frequency power amplifier circuit 50.

Additionally, as shown in FIG. 5B, the output impedance matching circuit 52 may be configured by an inductor L1 and capacitors C1 and C2. The feedback terminal 52c is disposed at the junction of the capacitor C1 and the inductor L1 through a capacitor C3. The feedback loop 53 is branched and then connected to the radio-frequency power amplifier circuit 50.

As shown in FIG. 4B, the inductors L1 and L2 are configured by internal electrodes which are formed in the dielectric multilayer substrate 30 so as to elongate in parallel, and the capacitors C1 and C2 equivalently indicate capacitances which are distributed between the internal electrodes. An end (the right end in FIG. 4B) of the inductor L2 is connected through a via hole (not shown) to a control input terminal of the power amplifier MMIC chip 31. The other end (the left end in FIG. 4B) of the inductor L2 is connected through another via hole (not shown) to an end of a load R configured by the chip components 33 mounted on the surface of the dielectric multilayer substrate 30. The other end of the load R is grounded.

In order to monitor a power, usually, a coupler circuit is used. In a coupler circuit, with respect to a traveling wave in the direction A shown in FIG. 5, a feedback amount which is equal to, for example, −20 dB of the energy of the traveling wave is obtained. The signal is detected by a diode or the like to obtain a signal of a DC level, whereby the output of the power amplifier circuit can be monitored. By contrast, with respect to a reflected wave B, the feedback amount is almost consumed by the load R, and little appears at the feedback terminal 52c. In the case where an isolator element is used, this coupler function is not necessary because a reflected wave hardly exists. In other words, when it is previously known that almost only the traveling wave exists, feedback from the input terminal of the isolator element is enabled simply by passing through one capacitor as shown in FIG. 5B.

In the embodiment, impedance conversion between the output of the power amplifier circuit and the input of the isolator element is always necessary. Therefore, the input and output impedances of the coupler circuit are designed so as to match respectively with the output impedance of the power amplifier circuit and the input impedance of the isolator element, so that the coupler circuit can be used as an impedance conversion circuit and also as an output monitor circuit for the power amplifier circuit.

By contrast, in the embodiment, the branching portion of the feedback loop is disposed in the impedance matching circuit, whereby the structure of the feedback loop can be simplified. As a result, the radio-frequency output stage can be further miniaturized.

In the isolator element, the input port 39a, the output port 39b, and a dummy port 39c are disposed on the upper face of the ferrite block 38. These ports are connected in a substantially same plane to the output terminal electrode 36, the output electrode 44, and the electrode 45 which are disposed on the upper face of the dielectric multilayer substrate 30, respectively.

The ferrite block 38 having the central conductor 39 is insertedly disposed in the through hole 37 of the dielectric multilayer substrate 30. In this way, the ferrite block 38 is not mounted on the dielectric multilayer substrate 30, but is fitted into the through hole 37. Therefore, it is possible to prevent the total height of the radio frequency signal output module having a power amplifier and an isolator element from being increased. Namely, the radio frequency signal output module having a power amplifier and an isolator element can be further thinned. Since the power amplifier MMIC chip 31 is connected to the input port 39a of the isolator element via the output impedance matching circuit 43 which is configured by the electrodes, the dielectric, and the conductor patterns that are formed in the dielectric multilayer substrate 30, the radio-frequency output stage which is configured mainly by the radio-frequency power amplifier circuit, the output impedance matching circuit, the isolator element, and the like is integrated into the single dielectric multilayer substrate 30. Therefore, the device can be largely miniaturized. It is a matter of course that the use of such an integrated radio-frequency output stage can decrease the number of components of a communication apparatus.

In the radio frequency signal output module having a power amplifier and an isolator element of the embodiment, for example, the mounting area is about 40 mm², and the mounting height is 2 mm at the maximum.

When the radio frequency signal output module having a power amplifier and an isolator element of the embodiment is used, therefore, the mounting area of the whole radio-frequency output stage can be reduced, the labor for designing a communication apparatus such as a portable telephone or a mobile communication terminal can be reduced, and variation of the performance of the whole communication apparatus can be suppressed to a minimum level.

Figure 6:
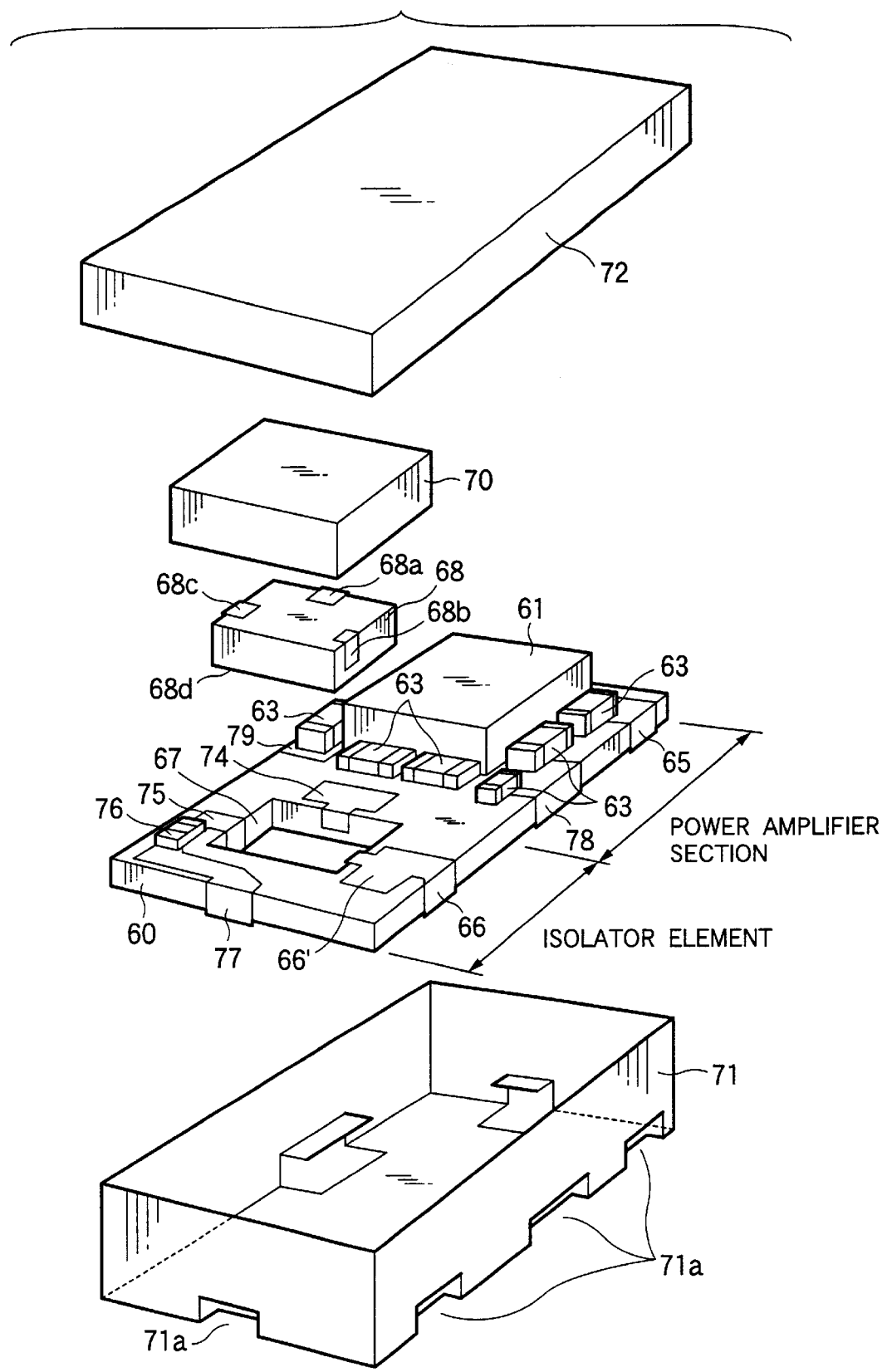
FIG. 6 is an exploded perspective view schematically showing the structure of a radio frequency signal output module having a power amplifier and an isolator element of another embodiment of the invention.
Figure 7A:
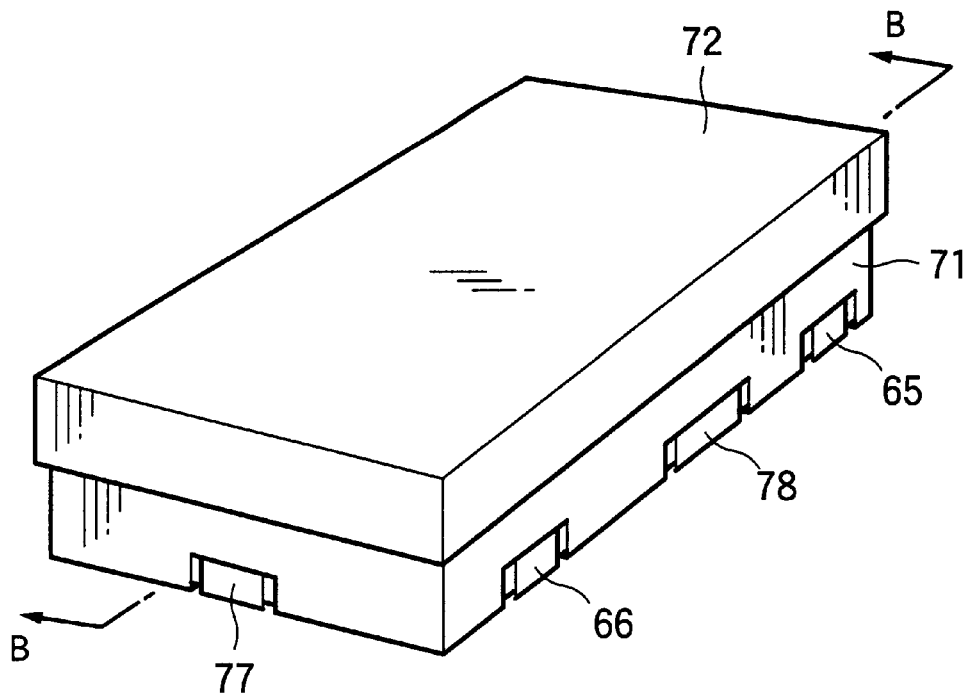
FIG. 7A shows a perspective view showing the appearance of the a radio frequency signal output module having a power amplifier and an isolator element of the embodiment of FIG. 6.
Figure 7B:
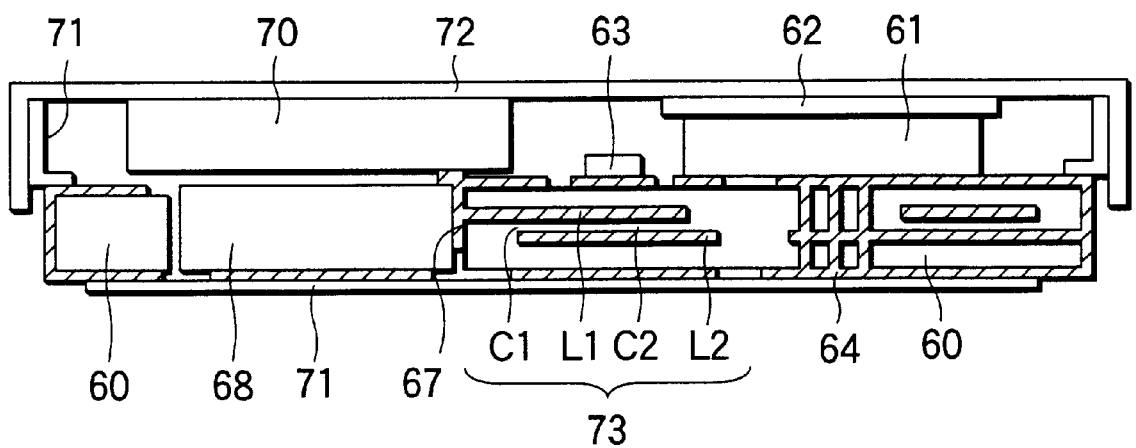
FIG. 7B is a section view taken along the line B—B of the perspective view.

FIG. 6 is an exploded perspective view schematically showing the structure of a radio frequency signal output module having a power amplifier and an isolator element of another embodiment of the invention, FIG. 7A is a perspective view showing the appearance of the radio frequency signal output module having a power amplifier and an isolator element of the embodiment of FIG. 6, and FIG. 7B is a section view taken along the line B—B of FIG. 7A.

Referring to the figures, 60 denotes a single dielectric multilayer substrate, 61 denotes a power amplifier MMIC chip which is mounted on the dielectric multilayer substrate 60, and which constitutes main portions of the radio-frequency power amplifier circuit, 62 denotes heat radiation spacers for the power amplifier MMIC chip 61, 63 denotes chip components which are similarly mounted on the dielectric multilayer substrate 60, 64 denotes an interconnection conductor which is formed in the dielectric multilayer substrate 60, and which is used for the radio-frequency power amplifier circuit, 65 denotes an input terminal electrode of the radio frequency signal output module having a power amplifier and an isolator element, 66 denotes an output terminal electrode of the radio frequency signal output module having a power amplifier and an isolator element and connected to an output port 68b of the isolator element, 67 denotes a rectangular through hole of the dielectric multilayer substrate 60, 68 denotes a rectangular ferrite block for the isolator element which is insertedly disposed in the through hole 67, and in which a central conductor is formed, 70 denotes a rectangular permanent magnet for the isolator element, 71 denotes a metal case member which is formed by a soft magnetic material, and in which a plurality of windows 71a are formed so that the member is not in contact with the terminal electrodes, 72 denotes a lid member which is similarly formed by a soft magnetic material, and which cooperates with the metal case member 71 to cover the whole of the radio frequency signal output module having a power amplifier and an isolator element, 73 denotes an output impedance matching circuit and an APC circuit which are configured by electrodes, a dielectric, and conductor patterns that are formed in the dielectric multilayer substrate 60, and which match the impedances of the power amplifier MMIC chip 61 and the isolator element with each other, 74 denotes an output electrode of the output impedance matching circuit 73 and connected to the input port 68a of the isolator element, 75 denotes an electrode which is grounded through a terminal resistor 76, and 77 to 79 denote ground terminal electrodes.

In the embodiment, the configurations, functions and effects of the output impedance matching circuit and the feedback loop are identical with those of the embodiment of FIG. 3.

In the isolator element, the input port 68a, the output port 68b, and a dummy port 68c are disposed on the upper and side faces of the ferrite block 68. These ports are connected to an output terminal electrode 66', the output electrode 74, and the electrode 75 which are disposed on the upper face of the dielectric multilayer substrate 30 and the inner face of the through hole 67, respectively. A ground electrode 68d is formed on substantially the entire lower face of the ferrite block 68.

Figure 8:
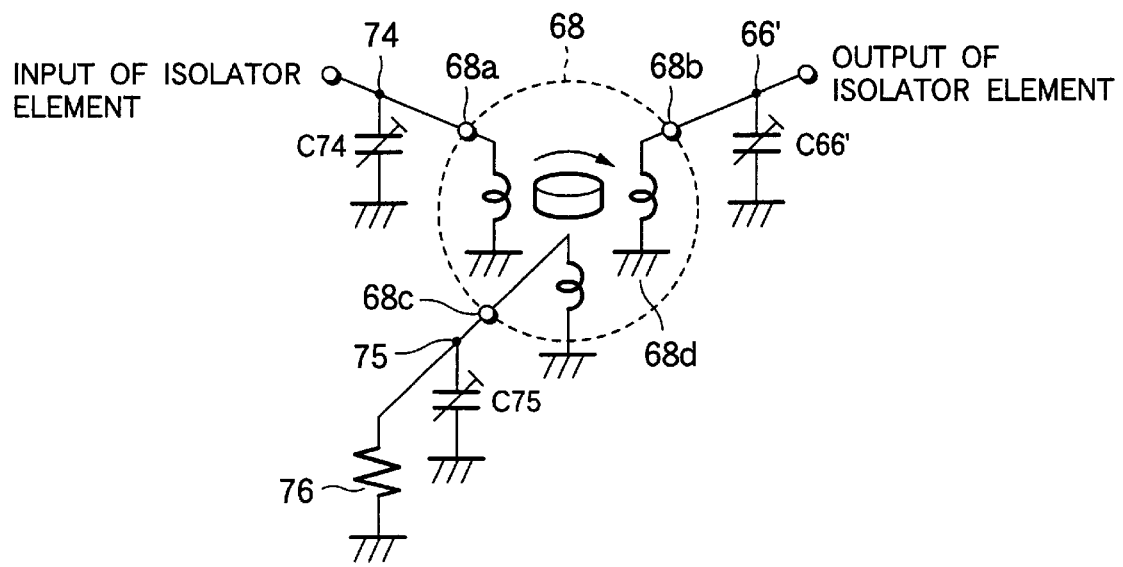
FIG. 8 is an equivalent circuit diagram of an isolator element in the embodiment of FIG. 6.
Figure 9A:
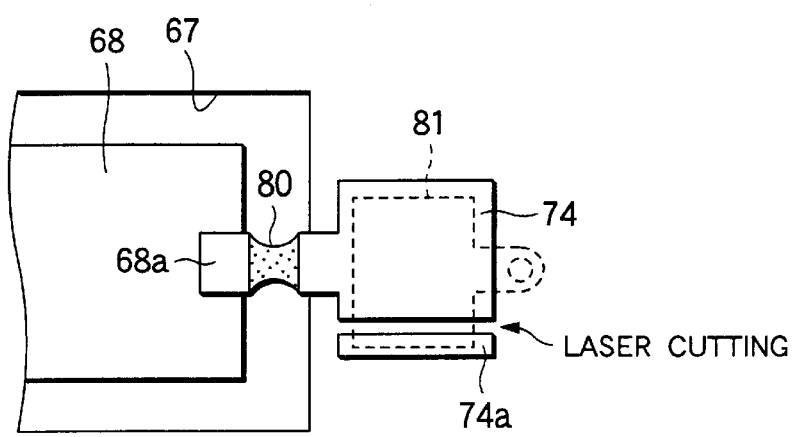
FIGS. 9A and 9B show a plan view and a section view which illustrate trimming of a capacitor connected to an output port of the isolator element in the embodiment of FIG. 6.
Figure 9B:
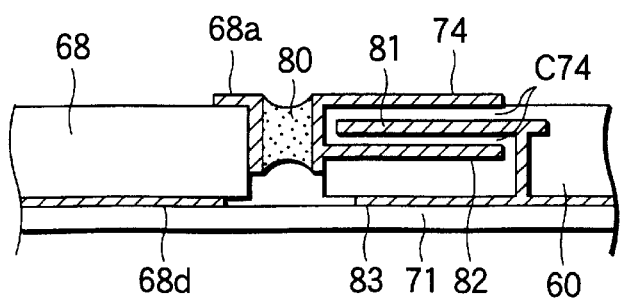

FIG. 8 is an equivalent circuit diagram of the isolator element in the embodiment of FIG. 6, and FIG. 9 is a view which illustrates trimming of a capacitor connected to the input port of the isolator element in the embodiment of FIG. 6, and in which FIG. 9A is a plan view and FIG. 9B is a section view.

In the embodiment, the area of one of the surface electrodes 74, 75, and 66' is adjusted by trimming, so that the value of capacitor C74, C75, or C66' shown in FIG. 8 can be adjusted.

Hereinafter, a case where the surface electrode 74 which is to be connected to the input port 68a of the isolator element is trimmed will be described with reference to FIG. 9.

As shown in FIGS. 9A and 9B, the input port 68a of the isolator element is electrically connected through solder 80 to the surface electrode 74 of the dielectric multilayer substrate 60. In the dielectric multilayer substrate 60, internal electrodes 81 and 82 are formed below the surface electrode 74, and the sum of the capacitance between the surface electrode 74 and the internal electrode 81, and that between the internal electrodes 81 and 82 is equal to the value of the capacitor C74. A ground electrode 83 is connected to the ground terminal electrodes 77 to 79 on the lower face of the dielectric multilayer substrate 60.

As shown in FIG. 9A, functional trimming in which a part 74a of the surface electrode 74 is removed away while monitoring the characteristics of the isolator element, such as laser trimming in which the removing is conducted by laser is performed, whereby the capacitance of the capacitor C74 connected to the input port of the isolator element can be changed. After the radio frequency signal output module having a power amplifier and an isolator element is assembled, therefore, the frequency characteristics of the isolator element can be very easily adjusted by functional trimming.

The ferrite block 68 incorporating the central conductor is insertedly disposed in the through hole 66 of the dielectric multilayer substrate 60. In this way, the ferrite block 68 is not mounted on the dielectric multilayer substrate 60, but is fitted into the through hole 66. Therefore, it is possible to prevent the total height of the radio frequency signal output module having a power amplifier and an isolator element from being increased. Namely, the radio frequency signal output module having a power amplifier and an isolator element can be further thinned. Since the power amplifier MMIC chip 61 is connected to the input port 68a of the isolator element via the output impedance matching circuit 73 which is configured by the electrodes, the dielectric, and the conductor patterns that are formed in the dielectric multilayer substrate 60, the radio-frequency output stage which is configured mainly by the radio-frequency power amplifier circuit, the output impedance matching circuit, the isolator element, and the like is integrated into the single dielectric multilayer substrate 60. Therefore, the device can be largely miniaturized. It is a matter of course that the use of such an integrated radio-frequency output stage can decrease the number of components of a communication apparatus.

In the radio frequency signal output module having a power amplifier and an isolator element of the embodiment, for example, the mounting area is about 40 mm², and the mounting height is 2 mm at the maximum.

When the radio frequency signal output module having a power amplifier and an isolator element of the embodiment is used, therefore, the mounting area of the whole radio-frequency output stage can be reduced, the labor for designing a communication apparatus such as a portable telephone or a mobile communication terminal can be reduced, and variation of the performance of the whole communication apparatus can be suppressed to a minimum level.

Figure 10:
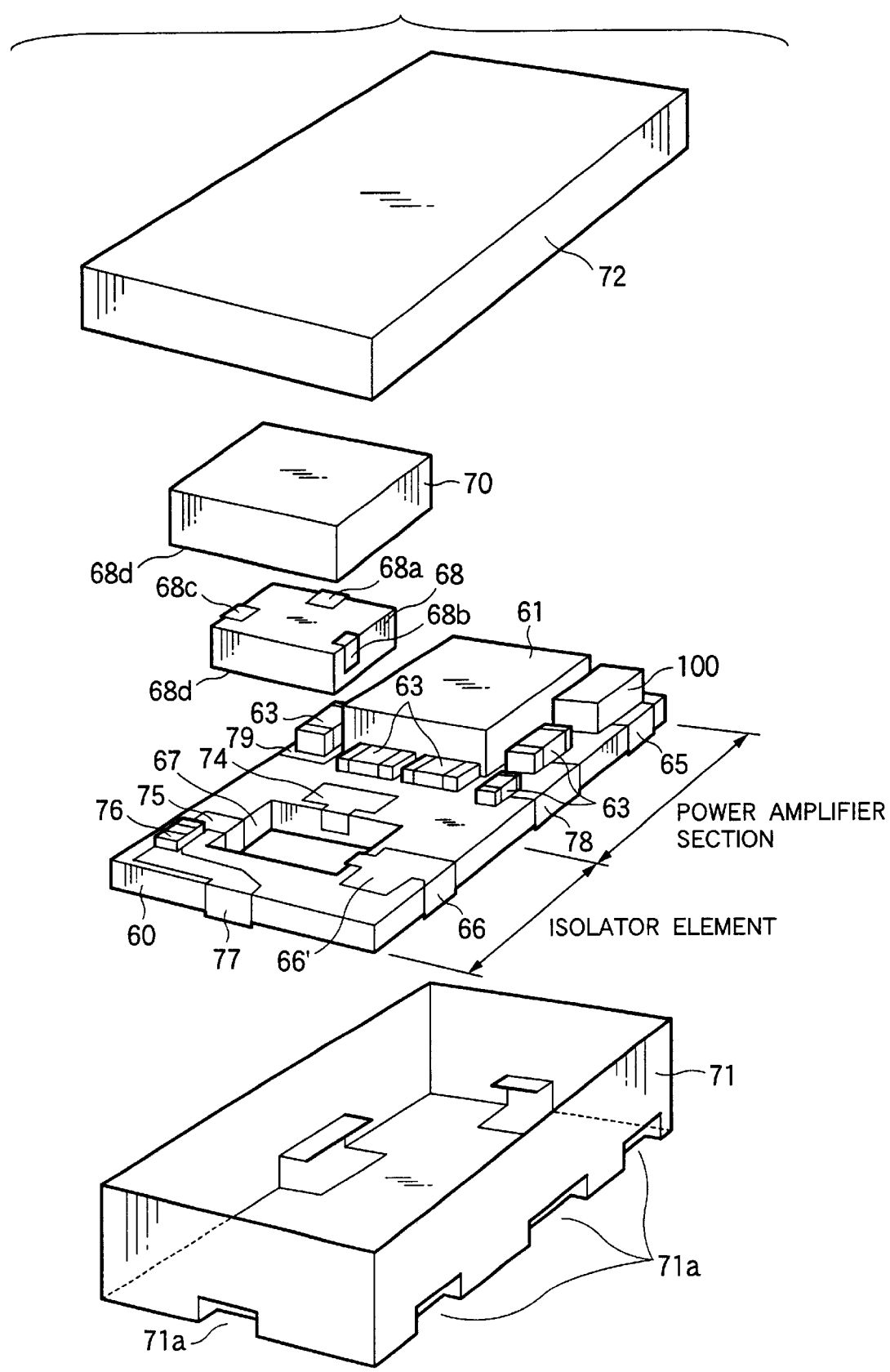
FIG. 10 is an exploded perspective view schematically showing the structure of a radio frequency signal output module having a power amplifier and an isolator element of a further embodiment of the invention.

FIG. 10 is an exploded perspective view schematically showing the structure of a radio frequency signal output module having a power amplifier and an isolator element of a further embodiment of the invention.

In the embodiment, a BPF is mounted integrally on the radio frequency signal output module having a power amplifier and an isolator element. The BPF is configured by a SAW element 100 which is connected to the input of the power amplifier MMIC chip 61 in the embodiment of FIG. 6, via an input impedance matching circuit that is not shown in FIG. 10. Although not illustrated, the input impedance matching circuit is configured by, for example, a π circuit of C-L-C or L-C-L, and formed by conductors and a dielectric in the dielectric multilayer substrate 60. As described above, the radio frequency signal output module having a power amplifier and an isolator element of the embodiment has the circuit configuration shown in FIG. 2.

The other configuration of the embodiment is strictly identical with that of the embodiment of FIG. 6. In FIG. 10, therefore, the components identical with those of FIG. 6 are denoted by the same reference numerals. Also the function and effect of the embodiment are identical with those of the embodiment of FIG. 6.

The embodiments described above show examples of the invention and are not intended to restrict the invention. The invention can be carried out in various other modifications and variations. Therefore, the scope of the invention is to be determined solely by the appended claims and their scope of equivalent.

[Effects of the Invention]

As described above in detail, according to the invention, the radio-frequency power amplifier circuit, the isolator element, the impedance matching circuit, and the feedback loop are integrally mounted on the dielectric multilayer substrate, and the feedback loop is branched from the impedance matching circuit, and connected to the radio-frequency power amplifier circuit. Since the radio-frequency output stage is integrated with the dielectric multilayer substrate in this way, the radio-frequency output stage can be largely reduced in size and thickness. This integration can decrease the number of components. Since the branching portion of the feedback loop is disposed in the impedance matching circuit, moreover, the structure of the feedback loop can be simplified. As a result, the radio-frequency output stage can be further miniaturized.

When the radio frequency signal output module having a power amplifier and an isolator element of the invention is used, it is possible to attain the following effects: (1) the mounting area of the whole radio-frequency output stage can be reduced; (2) the designer of a communication apparatus such as a portable telephone or a mobile communication terminal is not required to individually obtain components such as a radio-frequency power amplifier circuit and an isolator element and design an impedance matching circuit for connecting the components, and hence the labor for designing the communication apparatus can be reduced; and (3) variation of the performance of the whole communication apparatus can be suppressed to a minimum level.

What is claimed is:

1. A radio frequency signal output module comprising:

a dielectric multilayer substrate;

a radio-frequency power amplifier circuit;

an isolator element;

an impedance matching circuit which is inserted and connected between said radio-frequency power amplifier circuit and said isolator element; and a feedback loop for controlling a gain of said radio-frequency power amplifier circuit, wherein said radio-frequency power amplifier circuit, said isolator element, said impedance matching circuit, and said feedback loop are integrally mounted on said dielectric multilayer substrate, and said feedback loop is branched from said impedance matching circuit, and connected to said radio-frequency power amplifier circuit.

2. A radio frequency signal output module according to claim 1, wherein said impedance matching circuit is built in said dielectric multilayer substrate.

3. A radio frequency signal output module according to claim 1, wherein said impedance matching circuit is formed in and on said dielectric multilayer substrate.

4. A radio frequency signal output module according to claim 1, wherein said impedance matching circuit is formed by directional coupling means having a feedback terminal which is connected to said feedback loop.

5. A radio frequency signal output module according to claim 1, wherein at least a part of a capacitor which is connected to at least one port of said isolator element is configured by an internal electrode which is formed in said dielectric multilayer substrate, and a surface electrode which is formed on a surface of said dielectric multilayer substrate to be opposed to said internal electrode, said surface electrode being trimmable.

6. A radio frequency signal output module according to claim 1, wherein main portions of said isolator element are integrally insertedly disposed in a mounting portion which is formed by removing a part of said dielectric multilayer substrate.

7. A radio frequency signal output module according to claim 6, wherein said mounting portion is a through hole of said dielectric multilayer substrate.

8. A radio frequency signal output module according to claim 1, wherein said radio-frequency power amplifier circuit and said isolator element are covered by a common shild case.

9. A radio frequency signal output module according to claim 1, wherein said device further comprises: a (SAW) element which is mounted on said dielectric multilayer substrate, and which is connected to an input of said radio-frequency power amplifier circuit; and a matching circuit which is built in said dielectric multilayer substrate, and which matches an output impedance of said SAW element with an input impedance of said radio-frequency power amplifier circuit.

* * * * *